United States Patent
Tsuji et al.

(10) Patent No.: US 9,698,077 B2
(45) Date of Patent: Jul. 4, 2017

(54) HEAT CONDUCTIVE SILICONE COMPOSITION BASED ON COMBINATION OF COMPONENTS, HEAT CONDUCTIVE LAYER, AND SEMICONDUCTOR DEVICE

(71) Applicant: SHIN-ETSU CHEMICAL CO., LTD., Tokyo (JP)

(72) Inventors: Kenichi Tsuji, Annaka (JP); Kunihiro Yamada, Annaka (JP); Hiroaki Kizaki, Annaka (JP); Nobuaki Matsumoto, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 4 days.

(21) Appl. No.: 14/759,115

(22) PCT Filed: Dec. 20, 2013

(86) PCT No.: PCT/JP2013/084211
§ 371 (c)(1),
(2) Date: Jul. 2, 2015

(87) PCT Pub. No.: WO2014/115456
PCT Pub. Date: Jul. 31, 2014

(65) Prior Publication Data
US 2015/0357261 A1     Dec. 10, 2015

(30) Foreign Application Priority Data
Jan. 22, 2013   (JP) .................................. 2013-009073

(51) Int. Cl.
*H01L 23/34*       (2006.01)
*H01L 23/373*      (2006.01)
(Continued)

(52) U.S. Cl.
CPC ............ *H01L 23/3737* (2013.01); *C08K 3/00* (2013.01); *C08L 83/04* (2013.01); *C08L 83/06* (2013.01);
(Continued)

(58) Field of Classification Search
CPC ............ H01L 23/3737; H01L 23/3672; H01L 2224/73253; H01L 2224/16; C09K 5/14; C08K 3/00; C08L 83/06
(Continued)

(56) References Cited

U.S. PATENT DOCUMENTS 6,306,957 B1   10/2001  Nakano et al.
6,649,258 B2   11/2003  Yamada et al.
(Continued)

FOREIGN PATENT DOCUMENTS

EP   0 939 115 A1   1/1999
EP   1 878 767 A1   1/2008
(Continued)

OTHER PUBLICATIONS

International Search Report, issued in PCT/JP2013/084211, dated Apr. 8, 2014.
(Continued)

*Primary Examiner* — Kimberly Rizkallah
*Assistant Examiner* — Dilinh Nguyen
(74) *Attorney, Agent, or Firm* — Birch, Stewart, Kolasch & Birch, LLP

(57) ABSTRACT

Provided is a heat conductive silicone composition disposed between a heat generating electronic component and a member for dispersing heat, wherein the heat conductive silicone composition contains (A) an organopolysiloxane having at least two alkenyl groups in one molecule and having a dynamic viscosity at 25° C. of 10 to 100,000 mm²/s, (B) a hydrolyzable dimethylpolysiloxane having
(Continued)

three functional groups at one end expressed by formula (1), (C) a heat conductive filler having a heat conductivity of 10 W/m° C. or higher, (D) an organohydrogenpolysiloxane expressed by formula (2), (E) an organohydrogenpolysiloxane containing a hydrogen directly bonded to at least two silicon atoms in one molecule other than component (D), and (F) a catalyst selected from the group consisting of platinum and platinum compounds. The heat conductive silicone composition provides a cured object having a storage modulus, loss modulus, and coefficient of loss within appropriate ranges; peeling and pump out during heating/cooling cycle tending not to occur, and increases in thermal resistance being suppressed.

9 Claims, 1 Drawing Sheet

(51) Int. Cl.
    C09K 5/14        (2006.01)
    H01L 23/367      (2006.01)
    C08K 3/00        (2006.01)
    C08L 83/06       (2006.01)
    C08L 83/04       (2006.01)
    C08G 77/12       (2006.01)
    C08G 77/18       (2006.01)
    C08G 77/20       (2006.01)
    C08K 3/08        (2006.01)
    C08K 3/22        (2006.01)

(52) U.S. Cl.
    CPC ............ *C09K 5/14* (2013.01); *H01L 23/3672* (2013.01); *C08G 77/12* (2013.01); *C08G 77/18* (2013.01); *C08G 77/20* (2013.01); *C08K 2003/0812* (2013.01); *C08K 2003/2296* (2013.01); *H01L 2224/16* (2013.01); *H01L 2224/73253* (2013.01)

(58) Field of Classification Search
    USPC .......................... 257/712; 524/588, 425, 431
    See application file for complete search history.

(56) References Cited

U.S. PATENT DOCUMENTS

| | | | |
|---|---|---|---|
| 6,818,600 B2 | 11/2004 | Yamada et al. | |
| 7,329,706 B2 | 2/2008 | Fukui et al. | |
| 8,633,276 B2 | 1/2014 | Domae et al. | |
| 2003/0049466 A1* | 3/2003 | Yamada | C08K 3/08 428/447 |
| 2004/0242762 A1 | 12/2004 | Horikoshi et al. | |
| 2005/0110133 A1 | 5/2005 | Yamada et al. | |
| 2007/0149834 A1 | 6/2007 | Endo et al. | |
| 2008/0213578 A1* | 9/2008 | Endo | C08L 83/04 524/430 |
| 2011/0039738 A1 | 2/2011 | Nakayoshi et al. | |
| 2011/0188213 A1 | 8/2011 | Domae et al. | |
| 2012/0119137 A1 | 5/2012 | Tsuji et al. | |
| 2015/0148273 A1 | 5/2015 | Matsumoto et al. | |
| 2016/0060462 A1 | 3/2016 | Kitazawa et al. | |

FOREIGN PATENT DOCUMENTS

| | | | |
|---|---|---|---|
| JP | 61-157569 A | 7/1986 | |
| JP | 8-208993 A | 8/1996 | |
| JP | 2938428 B1 | 8/1999 | |
| JP | 2938429 B1 | 8/1999 | |
| JP | 2002-327116 A | 11/2002 | |
| JP | 2003-301189 A | 10/2003 | |
| JP | 3543663 B2 | 7/2004 | |
| JP | 3580366 B2 | 10/2004 | |
| JP | 2004-352947 A | 12/2004 | |
| JP | 2005-154532 A | 6/2005 | |
| JP | 2007-214224 A | 8/2007 | |
| JP | 3952184 B2 | 8/2007 | |
| JP | 2008-38137 A | 2/2008 | |
| JP | 4255287 B2 | 4/2009 | |
| JP | 2009-286855 A | 12/2009 | |
| JP | 2009-292928 A | 12/2009 | |
| JP | 2010-13521 A | 1/2010 | |
| JP | 4572243 B2 | 11/2010 | |
| JP | 4656340 B2 | 3/2011 | |
| JP | 2011-88953 A | 5/2011 | |
| JP | 2011-246536 A | 12/2011 | |
| JP | 4913874 B2 | 4/2012 | |
| JP | 4917380 B2 | 4/2012 | |
| JP | 2012-96361 A | 5/2012 | |
| JP | 2012-102283 A | 5/2012 | |
| JP | 4933094 B2 | 5/2012 | |
| JP | 5047505 B2 | 10/2012 | |
| JP | 2013-10862 A | 1/2013 | |

OTHER PUBLICATIONS

Written Opinion of the International Searching Authority, issued in PCT/JP2013/084211, dated Apr. 8, 2014.
International Search Report issued in PCT/JP2013/057383, mailed on Apr. 16, 2013.
Japanese Office Action dated Feb. 10, 2015, for Japanese Application No. 2012-098765.
Extended European Search Report dated Nov. 3, 2015, for European Patent Application No. 13780721.0.
International Preliminary Report on Patentability and Written Opinion of the International Searching Authority dated Nov. 24, 2015, for International Application No. PCT/JP2014/002397.
International Search Report dated Jun. 3, 2014, for International Application No. PCT/JP2014/002397.
Japanese Office Action dated Jan. 12, 2016, for Japanese Application No. 2013-147582.
U.S. Office Action dated Feb. 24, 2016, for U.S. Appl. No. 14/396,656.
U.S. Office Action dated Feb. 4, 2016, for U.S. Appl. No. 14/786,676.
U.S. Office Action dated May 23, 2016, for U.S. Appl. No. 14/786,676.

* cited by examiner

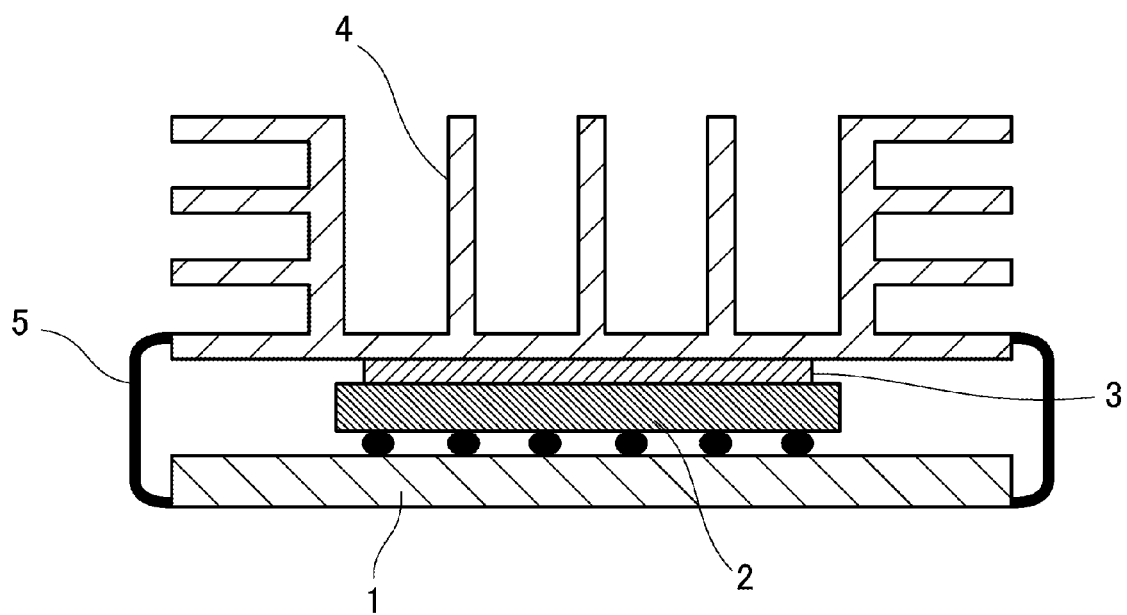

HEAT CONDUCTIVE SILICONE COMPOSITION BASED ON COMBINATION OF COMPONENTS, HEAT CONDUCTIVE LAYER, AND SEMICONDUCTOR DEVICE

TECHNICAL FIELD

This invention relates to a heat conductive silicone composition which is substantially unsusceptible to a pump-out phenomenon or peeling by repetition of heating and cooling when mounted on a heat generating member, a heat conductive layer, and a semiconductor device.

BACKGROUND ART

While it is well known that electronic parts such as LSIs and IC chips generate heat during operation and concomitantly degrade their performance, a variety of heat dissipating techniques are used to solve the problem. In one common technique, heat dissipation is carried out by disposing a cooling member near a heat generating member, bringing them in close contact, and effectively removing heat from the cooling member. If a gap is left between the heat generating member and the cooling member, the heat transfer becomes inefficient due to the intervention of air having low heat conduction, failing to fully reduce the temperature of the heat generating member. For the purpose of preventing air intervention to avoid such a phenomenon, heat dissipating materials, sheets and greases having a high thermal conductivity and conformable to the member surface are employed (JP 2938428, JP 2938429 and JP 3952184: Patent Documents 1 to 3).

Of the heat dissipating greases, one exemplary grease is used in such a way that it is sandwiched between a semiconductor chip and a heat spreader and heat cured so as to bring the semiconductor chip and the heat spreader in close contact. Many such materials have been reported (JP 5047505: Patent Document 4). The hitherto known materials, however, have a high storage modulus G'. They fail to conform to warp induced between a heat generating member and a cooling member by thermal cycling caused by switching on and off of the heat generating member, suggesting a situation that the heat dissipating grease may eventually peel from the substrate. On the other hand, on use of a non-reactive grease as the material having a low storage modulus G', pump-out may occur. Upon occurrence of peeling or pump-out as mentioned above, the close contact between the heat generating member and the cooling member is exacerbated to reduce the cooling efficiency, whereby the performance of the electronic part is degraded. The conventional materials have the problem that when peeling from the substrate or breakage of material itself occurs by warpage of a chip or heat spreader on which they are mounted, air will intervene therebetween to invite an outstanding increase of thermal resistance.

CITATION LIST

Patent Documents

Patent Document 1: JP 2938428
Patent Document 2: JP 2938429
Patent Document 3: JP 3952184
Patent Document 4: JP 5047505

SUMMARY OF INVENTION

Technical Problem

An object of the invention, which has been made under the above-mentioned circumstances, is to provide a heat conductive silicone composition which cures into a product which is unsusceptible to a pump-out phenomenon or peeling upon thermal cycling and suppresses thermal resistance from increasing, a heat conductive layer, and a semiconductor device.

Solution to Problem

Making extensive investigations to solve the outstanding problems, the inventors have found that when a heat conductive silicone composition comprising components (A) to (F) defined below is disposed between a heat generating electronic part and a heat dissipating member, the composition, due to an appropriate storage modulus, loss modulus and loss factor it imparts, is substantially unsusceptible to peeling or pump-out upon repeated thermal cycling, and thus effective for preventing thermal resistance from increasing. When the material is designed so as to have an appropriate loss factor, it ensures that even when peeling (interfacial peeling) or breakage (cohesive failure) of the material itself occurs, the material is improved in readhesion and any increase of thermal resistance after readhesion is suppressed. The present invention is predicated on these findings.

Accordingly, the invention provides a heat conductive silicone composition, a heat conductive layer, and a semiconductor device, as defined below.

[1] A heat conductive silicone composition to be disposed between a heat generating electronic part and a heat dissipating member, the silicone composition comprising the following components (A) to (F)

(A) 100 parts by weight of an organopolysiloxane containing at least two alkenyl groups per molecule and having a kinetic viscosity of 10 to 100,000 mm²/s at 25° C., (B) 50 to 150 parts by weight of a hydrolyzable dimethylpolysiloxane having tri-functionality at one end, represented by the general formula (1):

[Chemical Formula 1]

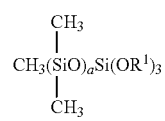

wherein a is a positive number of 5 to 100 and $R^1$ is an alkyl group of 1 to 6 carbon atoms, (C) a heat conductive filler having a thermal conductivity of at least 10 W/m° C., in an amount of 800 to 2,000 parts by weight per 100 parts by weight of components (A) and (B) combined, (D) an organohydrogenpolysiloxane represented by the general formula (2):

[Chemical Formula 2]

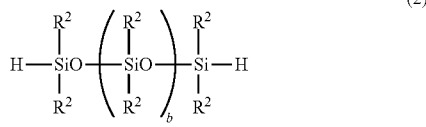

(2)

wherein b is a positive number of 5 to 500 and $R^2$ is an alkyl group of 1 to 6 carbon atoms,
(E) an organohydrogenpolysiloxane containing at least two silicon-bonded hydrogen atoms per molecule other than component (D), components (D) and (E) being blended in such amounts that the ratio of the number of Si—H groups in components (D) and (E) combined to the number of alkenyl groups in component (A) may range from 0.5 to 2.0, and the ratio of the number of Si—H groups in component (D) to the number of Si—H groups in component (E) may range from 0.6 to 10.0, and
(F) a catalyst selected from the group consisting of platinum and platinum compounds in such an amount as to provide 0.1 to 500 ppm of platinum atom based on component (A).
[2] The heat conductive silicone composition of [1], further comprising (G) an inhibitor for inhibiting the catalytic activity of component (F), selected from the group consisting of acetylene compounds, nitrogen compounds, organophosphorus compounds, oxime compounds and organic chlorine compounds, in an amount of 0.1 to 5% by weight based on component (A).
[3] The heat conductive silicone composition of [1] or [2], which cures into a product having a storage modulus G' of 2,000 Pa to 20,000 Pa, a loss modulus G" of 5,000 Pa to 40,000 Pa, and a loss factor tan δ of 0.8 to 3.0, at 150° C.
[4] The heat conductive silicone composition of any one of [1] to [3], wherein when the composition is coated to a substrate and cured into a product, the cured product has a thermal resistance value α, and when the cured product is subjected to cohesive failure or interfacial peeling from the substrate and tightly adhered to the substrate again, the cured product has a thermal resistance value β, the ratio β/α is up to 1.1.
[5] A heat conductive layer disposed between a heat generating electronic part and a heat dissipating member for conducting the heat from the heat generating electronic part to the heat dissipating member, said heat conductive layer being formed by curing the heat conductive silicone composition of any one of [1] to [4].
[6] A semiconductor device comprising a heat generating electronic part, a heat dissipating member, and a heat conductive layer which is a cured product of the heat conductive silicone composition of any one of [1] to [4], wherein the heat generating electronic part is bonded to the heat dissipating member through the heat conductive layer.
[7] The semiconductor device of [6] wherein said heat conductive layer has a thickness of up to 200 μm.
[8] The semiconductor device of [6] or [7] wherein said heat generating electronic part is a semiconductor element having a chip area of at least 50 $mm^2$.

Advantageous Effects of Invention

The heat conductive silicone composition of the invention has an appropriate range of storage modulus, loss modulus and loss factor, is substantially unsusceptible to peeling or pump-out upon thermal cycling, and thus effective for preventing thermal resistance from increasing. The design of the material for an appropriate range of loss factor ensures that even when peeling or breakage of the material itself occurs, lo the material is readherable to the substrate and its thermal resistance after readhesion is not significantly increased.

BRIEF DESCRIPTION OF DRAWINGS

The FIGURE is a schematic, elevational, cross-sectional view of one embodiment of the semiconductor device using the inventive composition.

DESCRIPTION OF EMBODIMENTS

The invention provides a heat conductive silicone composition comprising components (A) to (F), defined below.
A cured product of the heat conductive silicone composition should preferably have a storage elastic modulus G' of 2,000 Pa to 20,000 Pa, more preferably 2,000 Pa to 18,000 Pa at 150° C. If G' is less than 2,000 Pa, such a low storage modulus allows the composition to be pumped out during operation of the device. If G' exceeds 20,000 Pa, such a high modulus allows peeling to occur upon thermal cycling during device operation.
Also the cured product of the heat conductive silicone composition should preferably have a loss elastic modulus G" of 5,000 Pa to 40,000 Pa, more preferably 5,000 Pa to 35,000 Pa. If G" is less than 5,000 Pa, the composition is low viscous and less adherent, leading to an increase of thermal resistance. If G" exceeds 40,000 Pa, the composition will be pumped out during device operation.
Further the loss factor tan δ of the cured product is preferably in a range of 0.8 to 3.0, more preferably 0.8 to 2.5. If tan δ is less than 0.8, the composition will become hard and peel upon thermal cycling during device operation. If tan δ exceeds 3.0, the composition will be pumped out during device operation.
Component (A) used herein is an organopolysiloxane containing at least two alkenyl groups, each directly bonded to a silicon atom, per molecule. It may be linear or branched while it may be a mixture of two or more siloxanes having different viscosities. Exemplary alkenyl groups include vinyl, allyl, 1-butenyl and 1-hexenyl, with vinyl being preferred for ease of synthesis and cost. Examples of the remaining silicon-bonded organic groups include alkyl groups such as methyl, ethyl, propyl, butyl, hexyl, and dodecyl, aryl groups such as phenyl, aralkyl groups such as 2-phenylethyl and 2-phenylpropyl, and substituted hydrocarbon groups such as chloromethyl and 3,3,3-trifluoropropyl. Inter alia, methyl is preferred for ease of synthesis and cost. The silicon-bonded alkenyl group may be positioned at the end or intermediate of the molecular chain of organopolysiloxane, but preferably at least one alkenyl group be positioned at the end. The organopolysiloxane should have a kinematic viscosity of 10 to 100,000 $mm^2/s$, preferably 100 to 50,000 $mm^2/s$ as measured at 25° C. by an Ostwald viscometer.
Component (B) is a hydrolyzable dimethylpolysiloxane having tri-functionality at one end, represented by the general formula (1):

[Chemical Formula 3]

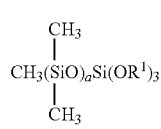

(1)

wherein a is a positive number of 5 to 100 and R¹ is an alkyl group of 1 to 6 carbon atoms.

In formula (1) representative of the single-end-tri-functionalized hydrolyzable dimethylpolysiloxane, a is in the range of 5 to 100, preferably 10 to 60. If a is less than 5, the composition undergoes serious oil bleeding and becomes less reliable. If a is more than 100, wetting becomes insufficient.

An amount of the single-end-tri-functionalized hydrolyzable dimethylpolysiloxane added is 50 to 150 parts, preferably 60 to 150 parts, more preferably 60 to 130 parts, and even more preferably 60 to 120 parts by weight per 100 parts by weight of component (A). If the amount is less than 50 parts, sufficient wetting is not exerted. If the amount is more than 150 parts, the composition undergoes serious oil bleeding and becomes less reliable, and also loses reliability after readhesion.

Component (C) is a heat conductive filler having a thermal conductivity of at least 10 W/m° C.

Component (C) may have an average particle size of 0.1 to 100 μm, especially 0.1 to 50 μm. If the average particle size is less than 0.1 μm, the resulting composition does not behave like grease and becomes less spreadable. If the average particle size is more than 100 μm, the heat dissipating grease lacks uniformity and exacerbates its readhesion ability. It is noted that the average particle size is a volume average diameter as measured on volume basis by Microtrac MT3300EX by Nikkiso Co., Ltd. Component (C) may be of any shape, for example, irregular or spherical shape.

An amount of component (C) filler is in the range of 800 to 2,000 parts, preferably 800 to 1,800 parts by weight per 100 parts by weight of components (A) and (B) combined. If the amount is less than 800 parts, the composition has a low thermal conductivity. If the amount is more than 2,000 parts, the composition increases its viscosity and becomes less spreadable.

As component (C), a heat conductive filler having a thermal conductivity of at least 10 W/m° C. is used. If the filler has a thermal conductivity of less than 10 W/m° C., the heat conductive silicone grease composition has a low thermal conductivity. Suitable heat conductive fillers include aluminum powder, copper powder, silver powder, iron powder, nickel powder, gold powder, tin powder, metallic silicon powder, aluminum nitride powder, boron nitride powder, alumina powder, diamond powder, carbon powder, indium powder, gallium powder, zinc oxide powder, aluminum oxide powder, etc. Any desired filler may be used as long as it has a thermal conductivity of at least 10 W/m° C. The filler may be used alone or in admixture of two or more.

Component (D) is an organohydrogenpolysiloxane represented by the general formula (2):

[Chemical Formula 4]

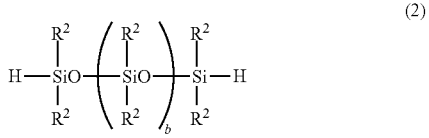

(2)

wherein b is a positive number of 5 to 500 and R² is an alkyl group of 1 to 6 carbon atoms.

In formula (2) representative of the organohydrogenpolysiloxane as component (D), b is in the range of 5 to 500, preferably 5 to 100. If b is less than 5, the organohydrogenpolysiloxane becomes volatile and inadequate for use with electronic parts. If b is more than 500, it has a high viscosity and becomes difficult to handle. R² is an alkyl group selected from among methyl, ethyl, propyl, butyl and hexyl, with methyl being preferred for ease of synthesis and cost.

Component (E) is an organohydrogenpolysiloxane other than component (D).

The Si—H group-containing organohydrogenpolysiloxane as component (E) should contain at least two Si—H groups per molecule in order that the composition become network via crosslinking. Examples of the remaining silicon-bonded organic groups include alkyl groups such as methyl, ethyl, propyl, butyl, hexyl, and dodecyl, aryl groups such as phenyl, aralkyl groups such as 2-phenylethyl and 2-phenylpropyl, and substituted hydrocarbon groups such as chloromethyl and 3,3,3-trifluoropropyl. Also included are epoxy ring-containing organic groups such as 2-glycidoxyethyl, 3-glycidoxypropyl and 4-glycidoxybutyl. The Si—H group-containing organohydrogenpolysiloxane may be linear, branched or cyclic, or a mixture thereof.

Examples of component (E) are given below.

[Chemical Formula 5]

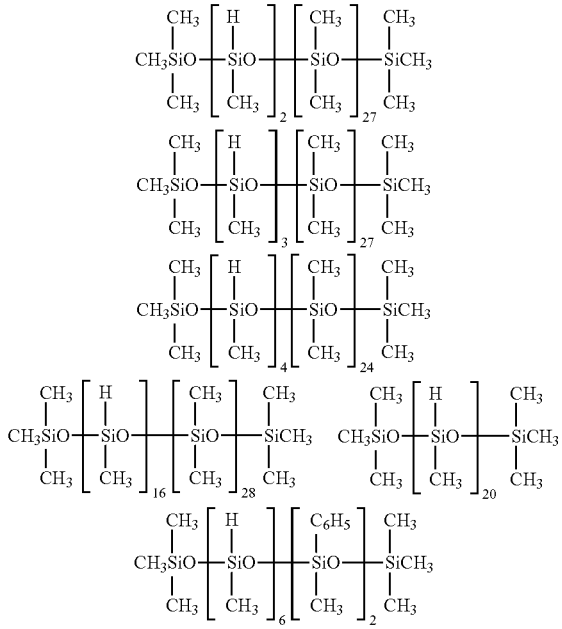

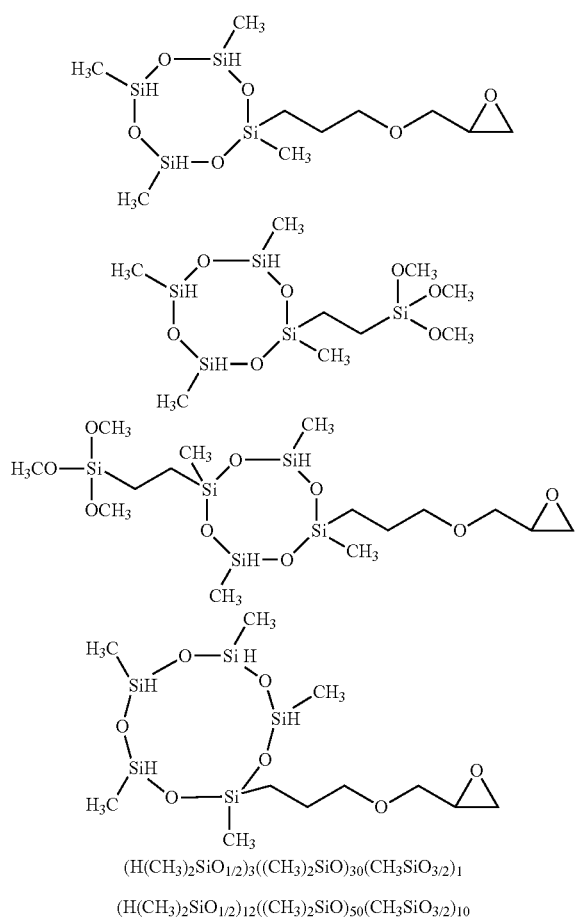

$(H(CH_3)_2SiO_{1/2})_3((CH_3)_2SiO)_{30}(CH_3SiO_{3/2})_1$ $(H(CH_3)_2SiO_{1/2})_{12}((CH_3)_2SiO)_{50}(CH_3SiO_{3/2})_{10}$

Components (D) and (E) are blended in such amounts that the ratio of the number of Si—H groups in components (D) and (E) combined to the number of alkenyl groups in component (A) may be in a range of from 0.5 to 2.0, preferably from 0.5 to 1.8. If the ratio is less than 0.5, the composition does not become fully network, so that the loss factor tan δ becomes too high. If the ratio is more than 2.0, the loss factor tan δ becomes too low. From the standpoint of readhesion, the ratio is preferably in a range of from 0.7 to 1.5, more preferably from 0.7 to 1.3, for the reason that if the ratio is less than 0.7, the silicone composition after readhesion may be pumped out in the reliability test because the composition does not become fully network, and if the ratio is more than 1.5, the crosslinking density becomes so high that the readhesion ability may not be exerted.

Also, the ratio of the number of Si—H groups in component (D) to the number of Si—H groups in component (E) ranges from 0.6 to 10.0. If the ratio is more than 10.0, the loss modulus G" becomes too high and reliability is exacerbated. If the ratio is less than 0.6, the crosslinking density becomes so high that the readhesion ability may not be exerted. More preferably the ratio ranges from 1.0 to 6.0.

Component (F) is a catalyst selected from among platinum and platinum compounds, which serves to promote addition reaction between alkenyl groups in component (A) and Si—H groups in component (B). Examples of component (F) include elemental platinum, chloroplatinic acid, platinum-olefin complexes, platinum-alcohol complexes, and platinum coordination compounds. Component (F) may be added in such an amount as to provide 0.1 to 500 ppm of platinum based on the weight of component (A).

If necessary, the silicone composition may further comprise (G) an inhibitor for inhibiting the catalytic activity of component (F), selected from among acetylene compounds, nitrogen compounds, organophosphorus compounds, oxime compounds and organic chlorine compounds.

The inhibitor as component (G) serves to inhibit the progress of hydrosilylation reaction at room temperature for extending the shelf life and pot life. As the reaction inhibitor, any well-known compounds may be used, such as acetylene compounds, nitrogen compounds, organophosphorus compounds, oxime compounds and organic chlorine compounds. Component (G) may be added in an amount of 0.1 to 5% by weight based on component (A). The inhibitor may be used after it is diluted with toluene or the like to improve its dispersion in silicone resin.

Besides the foregoing components (A) to (G), an antioxidant or the like may be added to the composition for preventing its degradation.

The silicone composition of the invention may be prepared by mixing components (A) to (G) on a mixer, for example, Trimix, Twin Mix, Planetary Mixer (trade names of mixers by Inoue Mfg., Inc.), Ultra Mixer (trade name of mixer by Mizuho Industrial Co., Ltd.), or Hivis Disper Mix (trade name of mixer by Primix Corp.).

The silicone composition is a grease-like material having a viscosity of 10 to 500 Pa·s, especially 50 to 400 Pa·s at 25° C. and cures at 70 to 300° C. for 30 to 180 minutes.

As mentioned above, the silicone composition cures into a product typically having a storage modulus G' of 2,000 Pa to 20,000 Pa, a loss modulus G" of 5,000 Pa to 40,000 Pa, and a loss factor tan δ of 0.8 to 3.0, at 150° C.

Also, the silicone composition cures into a product typically having a thermal conductivity of 0.1 to 20 W/mK, especially 1 to 10 W/mK, and a thermal resistance of 3 to 11 $mm^2 \cdot K/W$, especially 4 to 10 $mm^2 \cdot K/W$.

Even in a situation wherein once the cured product of the heat conductive silicone composition is tightly adhered to a substrate such as a heat generating electronic part, peeling from the substrate (interfacial peeling) or breakage of the material itself (cohesive failure) occurs, the cured product is improved in readhesion to the substrate so that it may have a thermal resistance in the above-defined range even after readhesion. In this context, provided that the cured product has a thermal resistance value α prior to interfacial peeling or cohesive failure, and a thermal resistance value β after readhesion, the ratio β/α is preferably 1.1 or lower. The lower limit of this ratio is typically 0.5 or higher though not critical.

It is noted that the above value of β/α is achievable by designing the material so as to have an appropriate range of loss factor.

In this case, the thermal resistance remains substantially unchanged even after 1,500 cycles of a thermal cycling test between −55° C. (30 min.) and 125° C. (30 min.) and especially after 1,000 cycles of a thermal cycling test between −40° C. (30 min.) and 125° C. (30 min.).

The cured product of the silicone composition is disposed between a heat generating electronic part and a heat dissipating member as a heat conductive layer for efficiently conducting the heat from the heat generating electronic part to the heat dissipating member.

Specifically, the cured product of the silicone composition is used as a heat conductive cured product which is interposed between a heat generating electronic part and a heat dissipating member to form a heat conductive layer. Then, a semiconductor device having improved heat dissipating properties is provided using the inventive composition. That is, a semiconductor device is provided, comprising a heat generating electronic part, a heat dissipating member, and a heat conductive layer which is a cured product of the inventive composition, wherein the heat generating electronic part is bonded to the heat dissipating member through the heat conductive layer.

The semiconductor device may be manufactured, in the embodiment wherein the surface of the heat generating electronic part or heat dissipating member is coated, by a method comprising the steps of:

(a) coating the composition to the surface of the heat generating electronic part or heat dissipating member to form a coating layer (heat conductive layer) of the composition on the surface, (b) pressing the coating layer, the heat generating electronic part, and the heat dissipating member in close contact for fixedly joining them, and (c) treating the resulting structure at 80 to 180° C. for curing the coating layer into the heat conductive layer.

Referring to the FIGURE, the semiconductor device and its manufacture method are described. Notably, the device of the FIGURE. is merely one embodiment wherein the inventive composition is applied to the semiconductor device, and it is not meant that the semiconductor device of the invention is limited to the embodiment shown in the FIGURE.

First, the inventive composition which has been stored in the frozen state is allowed to stand at room temperature for spontaneous thawing into grease. Then an applicator such as syringe is charged with the liquid composition.

Onto the surface of the heat generating electronic part, for example, an IC package 2, typically CPU which is a heat generating electronic part mounted on a printed circuit board 1 in the FIGURE, the inventive composition is dispensed or coated by means of the syringe, to form a coating layer 3. A heat dissipating member, for example, a heat sink 4 of aluminum having heat dissipating fins is rested on the coating layer 3. The heat dissipating member 4 is pressed in contact with the IC package 2 via the coating layer 3 by means of a clamp 5, for fixedly joining them. The semiconductor element used herein such as IC preferably has a chip area of at least 50 mm².

At this point, the clamp 5 is typically adjusted or selected such that the coating layer 3 sandwiched between the IC package 2 and the heat dissipating member 4 may have a thickness of preferably 200 μm or less, more preferably 180 μm or less. If the coating layer is too thin, the inventive composition may insufficiently conform to the IC package 2 and the heat dissipating member 4 during the pressing step, leaving a gap therebetween. Thus the lower limit of thickness is preferably 10 μm or greater. Inversely, if the coating layer is too thick, no sufficient heat dissipating effect may be exerted due to the increased thermal resistance.

Next, the assembly constructed as above is passed through a heating unit such as reflow furnace for curing the coating layer 3 of the inventive composition into a heat conductive layer. The temperature condition required for curing is 80 to 180° C., preferably 100 to 180° C. A temperature of lower than 80° C. may result in under-cure whereas the electronic part and substrate may be degraded at a temperature in excess of 180° C.

On use and operation of the semiconductor device thus obtained, the heat generating electronic part such as IC package typically generates heat so that its surface reaches as high a temperature as about 60 to 120° C. With respect to this heat generation, the heat conductive layer composed of the cured product of the inventive composition exhibits high heat conduction. Even when peeling from the substrate such as the heat generating electronic part (interfacial peeling) or breakage of the material itself (cohesive failure) occurs, the heat conductive layer is improved in readhesion so that any increase of thermal resistance after readhesion is minimized.

It is noted that an equivalent effect is achievable by pre-forming a sheet-like cured product of desired thickness from the inventive composition and interposing the sheet-like cured product between the heat generating electronic part and the heat dissipating member like the conventional heat conductive sheets. Besides, the cured product of the inventive composition in sheet form is also applicable as a part in other devices for which heat conduction and heat resistance are necessary.

EXAMPLES

Examples are given below for further illustrating the invention.

Examples 1 to 13 and Comparative Examples 1 to 5

Tests relating to the effects of the invention were conducted as follows.

[Modulus Evaluation]

A heat conductive silicone composition was coated between two parallel plates of diameter 2.5 cm to a thickness of 2 mm. The program was set such that the coated plates was heated from 25° C. at a rate of 5° C./min and held at 150° C. for 120 minutes whereupon a storage modulus G', loss modulus G", and loss factor tan δ were measured. Measurement was made using a viscoelasticity meter (Model RDAIII by Rheometric Scientific Inc.), and measurement values after 5,620 seconds or 7,200 seconds from the start of heating were recorded.

[Thermal Resistance Measurement I]

A heat conductive silicone composition was sandwiched between two aluminum disks of diameter 12.7 mm, which was held in an oven at 150° C. for 90 minutes for heat curing the heat conductive silicone composition into a specimen for thermal resistance measurement. Thermal resistance was measured. Further, the specimen was statically held in a thermal cycling test between −55° C. (30 min) and 125° C. (30 min) per cycle. After 1,500 cycles, thermal resistance was measured again. Notably, thermal resistance measurement was performed by NanoFlash (LFA447 by Netzsch GmbH).

[Thermal Resistance Measurement II]

A heat conductive silicone composition was sandwiched between two aluminum disks of diameter 12.7 mm, which was held in an oven at 150° C. for 90 minutes for heat curing the heat conductive silicone composition into a specimen for thermal resistance measurement. Thermal resistance was measured, with the measurement being designated thermal resistance α. Once the material was intentionally peeled by pulling the disks apart, they were pressed at room temperature. Thermal resistance was measured again, with the measurement being designated thermal resistance β. Thereafter, a thermal cycling test (between −40° C. (30 min) and 125° C. (30 min) per cycle) was performed 1,000 cycles. A change of thermal resistance was observed. Notably, thermal resistance measurement was performed by NanoFlash (LFA447 by Netzsch GmbH).

[Viscosity]

The absolute viscosity of a heat conductive silicone composition was measured at 25° C. by a viscometer (Type PC-1TL by Malcom Co., Ltd.).

[Thermal Conductivity]

A composition was cast into a frame of 3 cm thick and covered with household wrapping film whereupon measurement was made by a meter Model QTM-500 (Kyoto Electronics Mfg Co., Ltd.).

There were furnished the following components, from which compositions within the invention were formulated.

Component A
 A-1: dimethylpolysiloxane capped with dimethylvinylsilyl at both ends, having a kinematic viscosity of 600 mm$^2$/s at 25° C.

Component B
 B-1: hydrolyzable dimethylpolysiloxane of the following formula

[Chemical Formula 7]

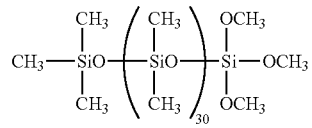

Component C

C-1 was prepared by mixing aluminum powders and zinc oxide powder, shown below, on a 5-L planetary mixer (Inoue Mfg., Inc.) in a mix ratio shown in Table 1 at room temperature for 15 minutes.
 aluminum powder with average particle size 2.0 μm
 aluminum powder with average particle size 20.0 μm
 zinc oxide powder with average particle size 1.0 μm

TABLE 1

| Component (C) | Aluminum powder with average particle size 2.0 μm | Aluminum powder with average particle size 20.0 μm | Zinc oxide powder with average particle size 1.0 μm |
|---|---|---|---|
| | | unit: g | |
| C-1 | 410 | 620 | 225 |

Component D
 organohydrogenpolysiloxanes of the following formulae

[Chemical Formula 8]

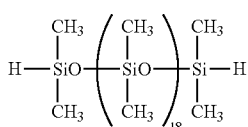

D-1

[Chemical Formula 9]

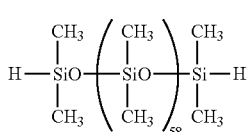

D-2

Component E

[Chemical Formula 10]

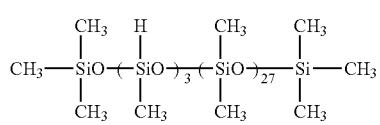

E-1

[Chemical Formula 11]

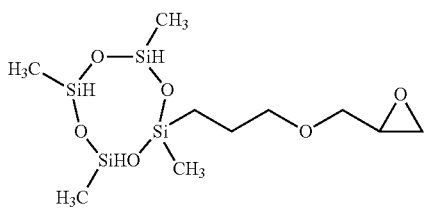

E-2

[Chemical Formula 12]

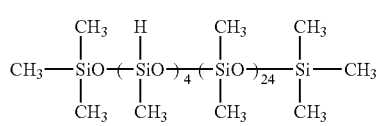

E-3

[Chemical Formula 13]

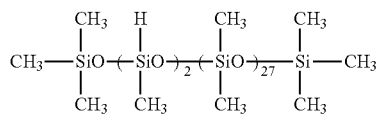

E-4

[Chemical Formula 14]

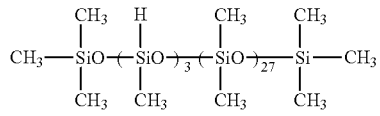

E-5

Component F
 F-1: solution of platinum-divinyltetramethyldisiloxane complex in A-1, containing 1 wt % of platinum atom Component G
 G-1: 50 wt % toluene solution of 1-ethynyl-1-cyclohexanol Components (A) to (G) were mixed to form heat conductive silicone compositions of Examples and Comparative Examples.

Specifically, a 5-L planetary mixer (Inoue Mfg., Inc.) was charged with component (A), to which components (B) and (C) were added in the amounts shown in Table 2 and mixed at 170° C. for 1 hour. The contents were cooled to room temperature, after which components (D), (E), (F) and (G) were added in the amounts shown in Table 2 and mixed until uniform.

TABLE 2

| Components (pbw) | Example 1 | 2 | 3 | 4 | 5 | 6 | 7 |
|---|---|---|---|---|---|---|---|
| A-1 | 100 | 100 | 100 | 100 | 100 | 100 | 100 |
| B-1 | 66 | 100 | 66 | 134 | 80 | 60 | 140 |
| C-1 | 2,090 | 2,430 | 2,090 | 2,850 | 2,210 | 1,970 | 2,860 |
| (C) per 100 pbw of (A) + (B) | 1,250 | 1,215 | 1,250 | 1,230 | 1,230 | 1,230 | 1,190 |
| D-1 | 8.8 | 7.9 | 7.9 | 7.9 | 7.2 | 6.0 | 6.1 |
| E-1 | | | 3.3 | | | 4.5 | |
| E-2 | 0.4 | 0.5 | | 0.5 | | | 0.8 |
| E-3 | | | | | 2.9 | | |
| [Si—H in (D) + (E)]/Si-Vi (number ratio) | 1.0 | 1.0 | 1.0 | 1.0 | 1.0 | 1.0 | 1.0 |
| [Si—H in (D)]/[Si—H in (E)] | 4.0 | 2.57 | 2.57 | 2.57 | 1.86 | 1.63 | 1.22 |
| F-1 | 0.30 | 0.30 | 0.30 | 0.30 | 0.30 | 0.30 | 0.30 |
| G-1 | 0.45 | 0.45 | 0.45 | 0.45 | 0.45 | 0.45 | 0.45 |
| Viscosity (Pa · s) | 224 | 175 | 210 | 162 | 191 | 293 | 153 |
| Thermal conductivity (W/mK) | 5.6 | 5.7 | 5.5 | 5.6 | 5.5 | 5.7 | 5.6 |
| Storage modulus G' (Pa) *[1] | 6,420 | 6,480 | 6,640 | 2,410 | 10,300 | 16,800 | 14,600 |
| Loss modulus G" (Pa) *[1] | 11,510 | 10,410 | 8,520 | 5,900 | 8,450 | 14,200 | 33,600 |
| Loss factor tanδ *[1] | 1.79 | 1.60 | 1.28 | 2.45 | 0.82 | 0.84 | 2.30 |
| Thermal resistance (mm$^2$ · K/W) *[2] | 7.5 | 7.8 | 7.6 | 7.9 | 7.7 | 7.7 | 8.0 |
| Thermal resistance *[2] after thermal cycling (mm$^2$ · K/W) | 7.4 | 8.1 | 7.7 | 7.7 | 7.8 | 7.6 | 7.9 |

*[1] values after 5,620 seconds from the start of heating
*[2] results of thermal resistance measurement I

TABLE 3

| Components (pbw) | Comparative Example 1 | 2 | 3 | 4 |
|---|---|---|---|---|
| A-1 | 100 | 100 | 100 | 100 |
| B-1 | 80 | 134 | 67 | 67 |
| C-1 | 2,090 | 2,980 | 2,090 | 2,050 |
| (C) per 100 pbw of (A) + (B) | 1,160 | 1,280 | 1,260 | 1,230 |
| D-1 | 2.6 | 18.5 | 10.1 | 5.5 |
| E-1 | 1.8 | | 0.9 | |
| E-2 | | 0.75 | | 0.9 |
| E-3 | | | | |
| [Si—H in (D) + (E)]/Si-Vi (number ratio) | 0.4 | 2.1 | 1.0 | 1.0 |
| [Si—H in (D)]/[Si—H in (E)] | 1.5 | 4.0 | 11.5 | 1.0 |
| F-1 | 0.30 | 0.30 | 0.30 | 0.30 |
| G-1 | 0.45 | 0.45 | 0.45 | 0.45 |
| Viscosity (Pa · s) | 191 | 228 | 241 | 232 |
| Thermal conductivity (W/mK) | 5.4 | 5.6 | 5.7 | 5.8 |
| Storage modulus G' (Pa) *[1] | 4,850 | 19,000 | 18,200 | 260 |
| Loss modulus G" (Pa) *[1] | 23,300 | 6,000 | 45,310 | 1,630 |
| Loss factor tanδ *[1] | 4.80 | 0.32 | 2.49 | 6.27 |
| Thermal resistance (mm$^2$ · K/W) *[2] | 7.5 | 7.7 | 7.6 | 7.7 |
| Thermal resistance *[2] after thermal cycling (mm$^2$ · K/W) | 13.8 | 11.0 | 13.9 | 14.8 |

*[1] values after 5,620 seconds from the start of heating
*[2] results of thermal resistance measurement I On use of the heat conductive silicone compositions within the scope of the invention, the likelihood of pump-out and peeling was minimized. As a result, any increase of thermal resistance after the thermal cycling test could be inhibited.

TABLE 4

| Components (pbw) | Example 8 | 9 | 10 | 11 | 12 | 13 |
|---|---|---|---|---|---|---|
| A-1 | 100 | 100 | 100 | 100 | 100 | 100 |
| B-1 | 60 | 100 | 120 | 80 | 80 | 60 |
| C-1 | 1,396 | 1,824 | 2,018 | 1,595 | 1,606 | 1,512 |
| (C) per 100 pbw of (A) + (B) | 873 | 912 | 917 | 886 | 892 | 945 |
| D-2 | 12.0 | 34.6 | 21.6 | 20.0 | 25.6 | 31.9 |
| E-4 | 9.2 | | | 6.9 | | 4.1 |
| E-5 | | | 7.6 | | | |
| E-3 | | 2.1 | | | 2.7 | |
| [Si—H in (D) + (E)]/Si-Vi (number ratio) | 0.9 | 1.3 | 1.3 | 1.0 | 1.1 | 1.2 |

TABLE 4-continued

| Components (pbw) | Example | | | | | |
|---|---|---|---|---|---|---|
| | 8 | 9 | 10 | 11 | 12 | 13 |
| [Si—H in (D)]/[Si—H in (E)] | 0.66 | 4.0 | 1.0 | 1.5 | 2.3 | 4.0 |
| F-1 | 0.45 | 0.45 | 0.45 | 0.45 | 0.45 | 0.45 |
| G-1 | 0.3 | 0.3 | 0.3 | 0.3 | 0.3 | 0.3 |
| Viscosity (Pa · s) | 145 | 84 | 57 | 112 | 118 | 151 |
| Thermal conductivity (W/mK) | 4.2 | 4.1 | 4.5 | 4.2 | 4.2 | 4.2 |
| Storage modulus G' (Pa) *3 | 10,200 | 11,800 | 33,500 | 21,520 | 15,270 | 11,200 |
| Loss modulus G" (Pa) *3 | 8,670 | 17,820 | 29,640 | 20,370 | 21,080 | 13,090 |
| Loss factor tanδ *3 | 0.85 | 1.51 | 0.88 | 0.95 | 1.38 | 1.17 |
| Thermal resistance α (mm² · K/W) *4 | 9.9 | 10.1 | 9.6 | 10.3 | 10.4 | 10.6 |
| Thermal resistance β *4 after readhesion (mm² · K/W) | 10.5 | 10.3 | 10.1 | 10.7 | 10.6 | 10.8 |
| β/α *4 | 1.06 | 1.02 | 1.05 | 1.04 | 1.02 | 1.02 |
| Thermal resistance *4 after thermal cycling (mm² · K/W) | 11.2 | 11.3 | 10.4 | 11.3 | 11.2 | 11.6 |

*3 values after 7,200 seconds from the start of heating
*4 results of thermal resistance measurement II

TABLE 5

| Components (pbw) | Comparative Example 5 |
|---|---|
| A-1 | 100 |
| B-1 | 80 |
| C-1 | 1,558 |
| (C) per 100 pbw of (A) + (B) | 866 |
| D-2 | 10.0 |
| E-4 | 12.0 |
| E-5 | |
| E-3 | |
| [Si—H in (D) + (E)]/Si-Vi (number ratio) | 1.0 |
| [Si—H in (D)]/[Si—H in (E)] | 0.42 |
| F-1 | 0.45 |
| G-1 | 0.3 |
| Viscosity (Pa · s) | 114 |
| Thermal conductivity (W/mK) | 4.2 |
| Storage modulus G' (Pa) *3 | 30,210 |
| Loss modulus G" (Pa) *3 | 16,520 |
| Loss factor tanδ *3 | 0.55 |
| Thermal resistance α (mm² · K/W) *4 | 10.4 |
| Thermal resistance β *4 after readhesion (mm² · K/W) | 30.1 |
| β/α *4 | 2.9 |
| Thermal resistance *4 after thermal cycling (mm² · K/W) | 84.6 |

*3 values after 7,200 seconds from the start of heating
*4 results of thermal resistance measurement II Even when peeling from a substrate such as electronic part or breakage of the material itself occurs, the heat conductive silicone composition of the invention can be readhered to the substrate and maintain its thermal resistance substantially unchanged after readhesion, i.e., any increase of thermal resistance is suppressed.

REFERENCE SIGNS LIST

1 printed circuit board
2 IC package
3 coating layer (heat conductive layer)
4 heat dissipating member
5 clamp

The invention claimed is:

1. A heat conductive silicone composition to be disposed between a heat generating electronic part and a heat dissipating member, the heat conductive silicone composition comprising the following components (A) to (F)

(A) 100 parts by weight of an organopolysiloxane containing at least two alkenyl groups per molecule and having a kinetic viscosity of 10 to 100,000 mm²/s at 25° C., (B) 50 to 150 parts by weight of a hydrolyzable dimethylpolysiloxane having tri-functionality at one end, represented by the general formula (1):

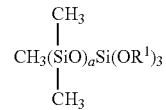

wherein a is a positive number of 5 to 100 and R' is an alkyl group of 1 to 6 carbon atoms, (C) a heat conductive filler having a thermal conductivity of at least 10 W/m° C., in an amount of 800 to 2,000 parts by weight per 100 parts by weight of components (A) and (B) combined, (D) an organohydrogenpolysiloxane represented by the general formula (2):

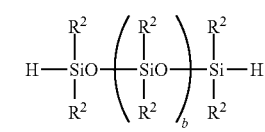

wherein b is a positive number of 5 to 500 and R² is an alkyl group of 1 to 6 carbon atoms, (E) an organohydrogenpolysiloxane containing at least two silicon-bonded hydrogen atoms per molecule other than component (D), components (D) and (E) being blended in such amounts that the ratio of the number of Si—H groups in components (D) and (E) combined to the number of alkenyl groups in component (A) may range from 0.5 to 2.0, and the ratio of the number of Si—H groups in component (D) to the number of Si—H groups in component (E) may range from 0.6 to 10.0, and (F) a catalyst selected from the group consisting of platinum and platinum compounds in such an amount as to provide 0.1 to 500 ppm of platinum atom based on component (A), wherein said silicone heat conductive composition cures into a product having a storage modulus G' of 2,000 Pa to 20,000 Pa, a loss modulus G" of 5,000 Pa to 40,000 Pa, and a loss factor tan δ of 0.8 to 3.0, at 150° C., and wherein said silicone composition cures at 150° C. into a product having a thermal resistance of 3 to 11 mm²·K/W.

2. The heat conductive silicone composition of claim 1, further comprising (G) an inhibitor for inhibiting the catalytic activity of component (F), selected from the group consisting of acetylene compounds, nitrogen compounds, organophosphorus compounds, oxime compounds and organic chlorine compounds, in an amount of 0.1 to 5% by weight based on component (A).

3. A heat conductive layer disposed between a heat generating electronic part and a heat dissipating member for conducting the heat from the heat generating electronic part to the heat dissipating member, said heat conductive layer being formed by curing the heat conductive silicone composition of claim 1.

4. A semiconductor device comprising a heat generating electronic part, a heat dissipating member, and a heat conductive layer which is a cured product of the heat conductive silicone composition of claim 1, wherein the heat generating electronic part is bonded to the heat dissipating member through the heat conductive layer.

5. The semiconductor device of claim 4 wherein said heat conductive layer has a thickness of up to 200 μm.

6. The semiconductor device of claim 4, wherein said heat generating electronic part is a semiconductor element having a chip area of at least 50 mm².

7. The heat conductive silicone composition of claim 1, which cures into a product having a thermal conductivity of 0.1 to 20 W/mK.

8. The heat conductive silicone composition of claim 1, which is a grease-like material having a viscosity of 10 to 500 Pa·s.

9. A heat conductive silicone composition comprising the following components (A) to (F)

(A) 100 parts by weight of an organopolysiloxane containing at least two alkenyl groups per molecule and having a kinetic viscosity of 10 to 100,000 mm²/s at 25° C., (B) 50 to 150 parts by weight of a hydrolyzable dimethylpolysiloxane having tri-functionality at one end, represented by the general formula (1):

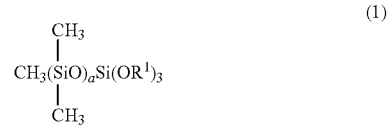

wherein a is a positive number of 5 to 100 and $R^1$ is an alkyl group of 1 to 6 carbon atoms, (C) a heat conductive filler having a thermal conductivity of at least 10 W/m° C., in an amount of 800 to 2,000 parts by weight per 100 parts by weight of components (A) and (B) combined, (D) an organohydrogenpolysiloxane represented by the general formula (2):

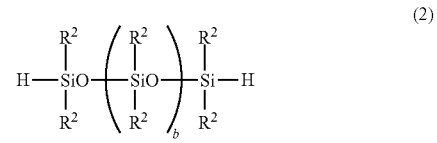

wherein b is a positive number of 5 to 500 and $R^2$ is an alkyl group of 1 to 6 carbon atoms, (E) an organohydrogenpolysiloxane containing at least two silicon-bonded hydrogen atoms per molecule other than component (D), components (D) and (E) being blended in such amounts that the ratio of the number of Si—H groups in components (D) and (E) combined to the number of alkenyl groups in component (A) may range from 0.5 to 2.0, and the ratio of the number of Si—H groups in component (D) to the number of Si—H groups in component (E) may range from 0.6 to 10.0, and (F) a catalyst selected from the group consisting of platinum and platinum compounds in such an amount as to provide 0.1 to 500 ppm of platinum atom based on component (A), wherein said heat conductive silicone composition cures into a product having a storage modulus G' of 2,000 Pa to 20,000 Pa, a loss modulus G" of 5,000 Pa to 40,000 Pa, and a loss factor tan δ of 0.8 to 3.0, at 150° C., and wherein said silicone composition cures at 150° C. into a product having a thermal resistance of 3 to 11 mm²·K/W, and wherein, when the composition is coated to a substrate and cured into a product, the cured product has a thermal resistance value α, and when the cured product is subjected to cohesive failure or interfacial peeling from the substrate and tightly adhered to the substrate again, the cured product has a thermal resistance value β, and the ratio β/α is up to 1.1.

* * * * *